(12) United States Patent
Schunemann et al.

(10) Patent No.: US 9,704,706 B2
(45) Date of Patent: Jul. 11, 2017

(54) ULTRA LONG LIFETIME GALLIUM ARSENIDE

(71) Applicant: BAE Systems Information and Electronic Systems Integration Inc., Nashua, NH (US)

(72) Inventors: Peter G. Schunemann, Hollis, NH (US); Kevin T. Zawilski, Arlington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 14/422,850

(22) PCT Filed: Jun. 11, 2014

(86) PCT No.: PCT/US2014/041932
§ 371 (c)(1),
(2) Date: Feb. 20, 2015

(87) PCT Pub. No.: WO2014/201129
PCT Pub. Date: Dec. 18, 2014

(65) Prior Publication Data
US 2015/0235848 A1   Aug. 20, 2015

Related U.S. Application Data

(60) Provisional application No. 61/833,582, filed on Jun. 11, 2013.

(51) Int. Cl.
*H01L 21/00* (2006.01)
*H01L 21/02* (2006.01)
*C22C 28/00* (2006.01)

(52) U.S. Cl.
CPC ........ *H01L 21/02546* (2013.01); *C22C 28/00* (2013.01); *H01L 21/0262* (2013.01); *H01L 21/02395* (2013.01)

(58) Field of Classification Search
None
See application file for complete search history.

(56) References Cited

U.S. PATENT DOCUMENTS

| | | | |
|---|---|---|---|
| 4,193,835 | A | 3/1980 | Asahi |
| 5,471,948 | A | 12/1995 | Burroughes et al. |
| 6,483,134 | B1 | 11/2002 | Weatherford et al. |
| 6,750,120 | B1 | 6/2004 | Kneissl et al. |

(Continued)

FOREIGN PATENT DOCUMENTS

WO   PCT/US2014/41932   6/2014

OTHER PUBLICATIONS

"Low Pressure Vapor Phase Epitaxy of GaAs in a Halogen Transport System" by Putz, 1981.*

(Continued)

*Primary Examiner* — Evren Seven
(74) *Attorney, Agent, or Firm* — Sand & Sebolt, LPA; Scott J. Asmus

(57) ABSTRACT

A novel bulk GaAs with an increased carrier lifetime of at least 10 microseconds has been produced. This novel GaAs has many uses to improve optical and electrical devices. The method of producing the GaAs crystal involves using a technique called low pressure hydride vapor phase epitaxy (LP-HVPE). In this technique, a gas containing Ga (typically GaCl) is reacted with a gas containing As (typically $AsH_3$) at the surface of a GaAs substrate. When grown under the proper conditions, the epitaxial, vapor grown GaAs crystal has ultra-long free carrier lifetimes of at least one order of magnitude greater than that of the previous art of 1 microsecond. This very long free carrier lifetime GaAs will be particularly useful as a semiconductor radiation detector (Continued)

material and is also expected to be useful for many other applications than include medical imaging, solar cells, diode lasers, and optical limiters and other applications.

18 Claims, 5 Drawing Sheets

(56) References Cited

U.S. PATENT DOCUMENTS

| | | |
|---|---|---|
| 7,112,545 B1 | 9/2006 | Railkar et al. |
| 2005/0233490 A1 | 10/2005 | Kasai et al. |
| 2007/0069302 A1 | 3/2007 | Jin et al. |
| 2009/0001519 A1 | 1/2009 | Haskell et al. |
| 2010/0052105 A1 | 3/2010 | Henley et al. |
| 2011/0155049 A1 | 6/2011 | Solomon |

OTHER PUBLICATIONS

"Thick orientation-patterned GaAs grown by low-pressure HVPE on fusion-bonded templates" by Lynch et. al., published May 29, 2012.*

"Ultralong minority-carrier lifetimes in GaAs grown by low-pressure organometallic vapor phase epitaxy" by Molenkamp et. al., published May 3, 1989.*

C. Lynch et al., "Characterization of HVPE-Grown Thick GaAs Structures For IR and THz Generation", Indium Phosphide and Related Materials Conference Proceedings, 2006 International Conference on Princeton, NJ. May 7, 2006, pp. 151-154.

M. Ettenberg et al., "Effect of gas-phase stoichiometry on the minority-carrier diffusion length in vapor-grown GaAs", Applied Physics Letters, vol. 29, No. 3, Jan. 1, 1976, p. 141.

G. H. Olsen et al., "Crystal Growth and Properties of Binary, Ternary and Quaternary (In,Ga)(As,P) Alloys Grown by the Hydride Vapor Phase Epitaxy Technique", Progress in Crystal Growth and Characterization, Pergamon, Oxford, 3B, vol. 2, Jan. 1, 1981, pp. 309-375.

European Search Report, EP 14810265.0, mailed Nov. 8, 2016, 11 pages.

A. Owens and A. Peacock, Compound Semiconductor Radiation Detectors, Nuclear Instruments and Methods in Physics Research Section A. vol. 531, Available online Jun. 11, 2004, pp. 18-37.

* cited by examiner

ULTRA LONG LIFETIME GALLIUM ARSENIDE

BACKGROUND OF THE INVENTION

1. Field of Invention

The current invention relates generally to a new embodiment of bulk GaAs with an increased carrier lifetime of at least 10 microseconds to be used for optical and electrical devices. The invention also relates to the apparatus, systems and methods for creating GaAs with very long free carrier lifetimes. More particularly, this very long free carrier lifetime GaAs is expected to be useful as a semiconductor radiation detector material, and also is expected to be useful for applications including, but not limited to, medical imaging, solar cells, diode lasers, and optical limiters.

2. Description of Related Art

GaAs is a well-known semiconductor and is grown by many methods. It can be produced using a variety of techniques including both bulk melt growth and vapor growth. Commercially available GaAs always has a significant concentration of a defect called EL2 (As on Ga antisite defects) which are known to greatly reduce the free-carrier lifetime of the material. The EL2 antisite defects form deep level traps and are inherent in any melt grown material due to a widening of the solubility curve of As in GaAs as the GaAs crystal temperature is near that of the melting point of the compound.

Crystal growth from the vapor phase can be done at a temperature significantly lower than that of the melting point of the compound, however, most vapor growth techniques such as molecular organic chemical vapor deposition (MOCVD) and molecular beam epitaxy (MBE) have growth rates that are much too slow to make growth of any material approaching that of bulk quantities (>100 micrometers) impractical.

GaAs with lower concentrations of EL2 defects or longer free carrier lifetimes would be useful because the electrons generated in a process like the absorption of radiation would be able to travel further distances through the GaAs before being trapped by a defect.

One area where longer lifetime (low EL2 defect) bulk GaAs is expected to be useful is in the manufacture of semiconductor radiation detectors. Improving the energy resolution of gamma radiation detectors is among the most important science and technology objectives for national security applications since it enables the use of high-resolution energy spectroscopy to distinguish between the natural radioactive isotopes, medical or commercially used radioisotopes, and radioisotopes that pose a threat.

Of the two primary classes of radiation detector materials—semiconductors and scintillators'semiconductors are fundamentally capable of much higher energy resolution because the information carriers are the electrons and holes directly produced by the energy cascade. Desirable properties in such a semiconductor are a room temperature operation—which requires a band gap between 1.35-2.55 eV (McGregor and Hermon, Nuclear Instruments and Methods in Physics Research A 395 (1997) 101), high electron and hole mobilities ($\mu$), and long carrier lifetimes ($\tau$). Historically, however, semiconductor radiation detectors have been limited by high cost, operational complexity, low efficiency due to limited size, and difficulty achieving high-purity, defect-free crystals. Unfortunately, progress in overcoming these obstacles over the years has been slow and incremental.

Progress in the development of high resolution, room temperature, gamma radiation detectors has been severely limited for many years by the size, quality, and transport properties of single crystal of compound semiconductors. $Cd_xZn_{1-x}Te$ (CZT) is the most commercially advanced of these materials, but Te inclusions, twins, and grain boundaries are constant barriers to the size, yield, and cost of these crystals for detector applications.

Gallium arsenide (GaAs) has been studied as a radiation detector since the early 1960's, predating CZT, but its widespread use for gamma ray detection has never been realized due to the presence of native deep level traps (EL2, i.e., AsGa antisites) which reduced its free carrier lifetime at room temperature. Otherwise, GaAs has very attractive intrinsic properties. Its band gap of 1.42 electron voltage (eV) is near optimum. Theory predicts that carrier lifetimes in very pure and well-ordered GaAs should approach 0.1 ms, but such long lifetimes have never historically been observed.

A need exists, therefore, for bulk GaAs with free-carrier lifetimes significantly greater than that of the previous state of the art of 1 microsecond.

SUMMARY

One aspect of an embodiment of the invention relates generally to a new embodiment of bulk GaAs with an increased carrier lifetime of at least 10 microseconds to be used for optical and electrical devices. Another aspect of an embodiment of the invention includes a method for growing gallium arsenide (GaAs) to produce material with ultra-long free carrier lifetimes (>10 microseconds). The method involves using a technique called low pressure hydride phase epitaxy (LP-HVPE). In this technique, GaCl gas is reacted with $AsH_3$ gas at the surface of a GaAs substrate. An epitaxial, high quality, vapor grown GaAs crystal is grown on top of the lower quality GaAs substrate in this manner. The epitaxial, vapor grown crystal is the material possessing the ultra-long free carrier lifetimes.

This very long free carrier lifetime GaAs is expected to be particularly useful as a semiconductor radiation detector material. GaAs produced through this method is also expected to be useful for applications including, but not limited to, medical imaging, solar cells, diode lasers, and optical limiters.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

This preferred embodiment is a new GaAs with an increased carrier lifetime of at least 10 microseconds that can be used for optical devices, electrical devices and other devices. The preferred embodiment of a new GaAs is created using a known, but little-used, method of vapor growth of semiconductor crystals, low pressure hydride phase epitaxy (LP-HVPE), to produce GaAs with the unique properties of having ultra-long free carrier lifetimes. This method of fabricating the preferred embodiment of a new GaAs crystal significantly advances the state of the art of semiconductor materials for multiple applications, including high resolution radiation detectors, dramatically improves the material quality, and is scalable to production of large quantities and aperture sizes.

Data supporting the increased free-carrier lifetime of GaAs grown in the LP-HVPE reactor include optical transmission spectra data, two photon non-linear absorption data, microwave-photoconductive decay (μ-PCD) data, and photoconductive decay (PCD) data.

Figure 1:
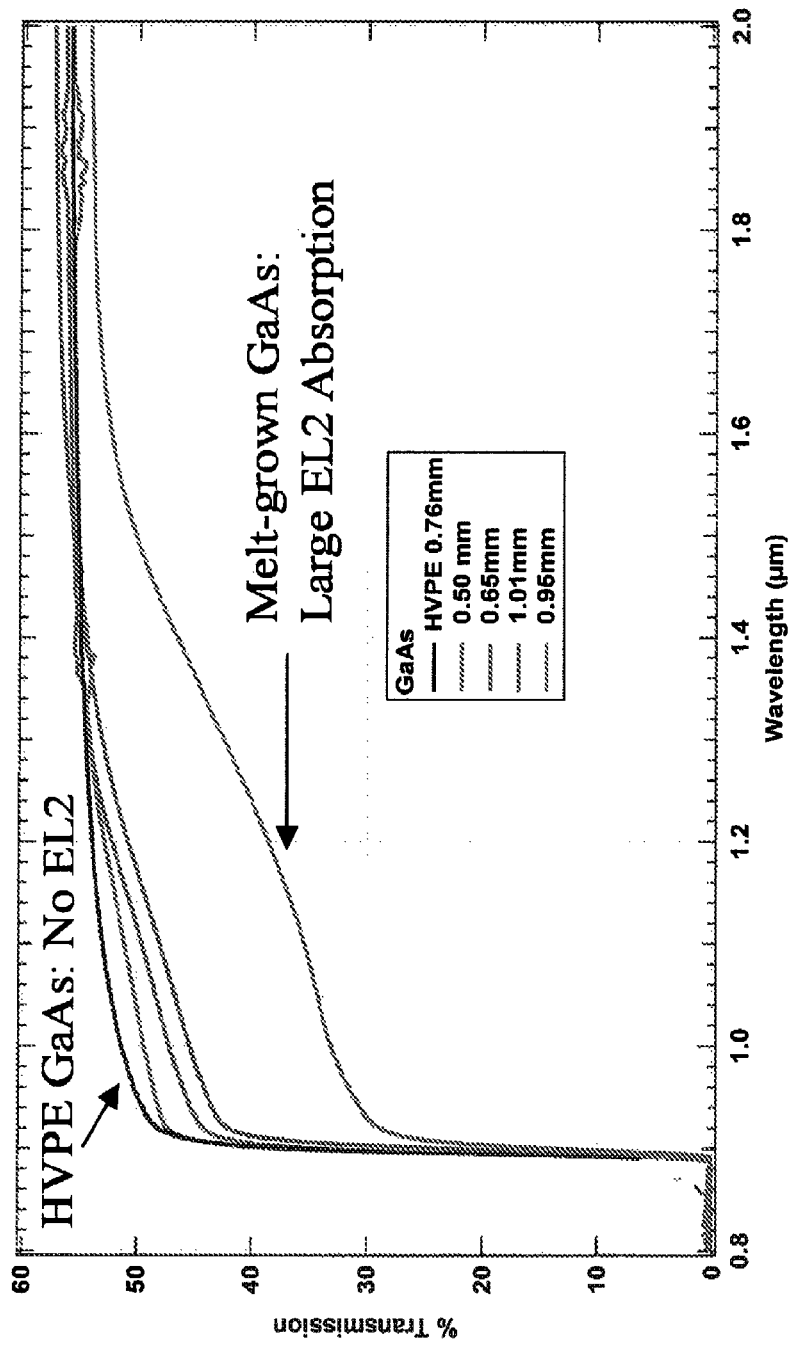
FIG. 1 shows optical transmission spectra of various GaAs samples near the band edge and that the HVPE GaAs is the only sample with no absorption as the wavelength approaches the bandedge.

Spectral transmission data comparing the novel preferred embodiment HVPE GaAs to traditional melt-grown crystals shows that the HVPE GaAs is free of any near-band-edge absorption whereas the melt-grown GaAs samples exhibit a broad absorption shoulder that extends from the band edge to 1.3 μm and beyond due a high concentration of EL2 (AsGa) defects which are known to kill the carrier lifetime in GaAs radiation detectors (P. J. Sellin et al., *Nucl. Instr. and Meth. A* 460, 207, 2001). FIG. 1 shows the optical absorption spectra of various types of GaAs. Note that the preferred HVPE GaAs with little/no EL2 does not show any absorption until the bandedge (~0.9 microns) while the other prior art GaAs samples all have varying degrees of absorption (attributable to the EL2 defect) from 0.9 microns to 1.2 microns and beyond.

Figure 2:
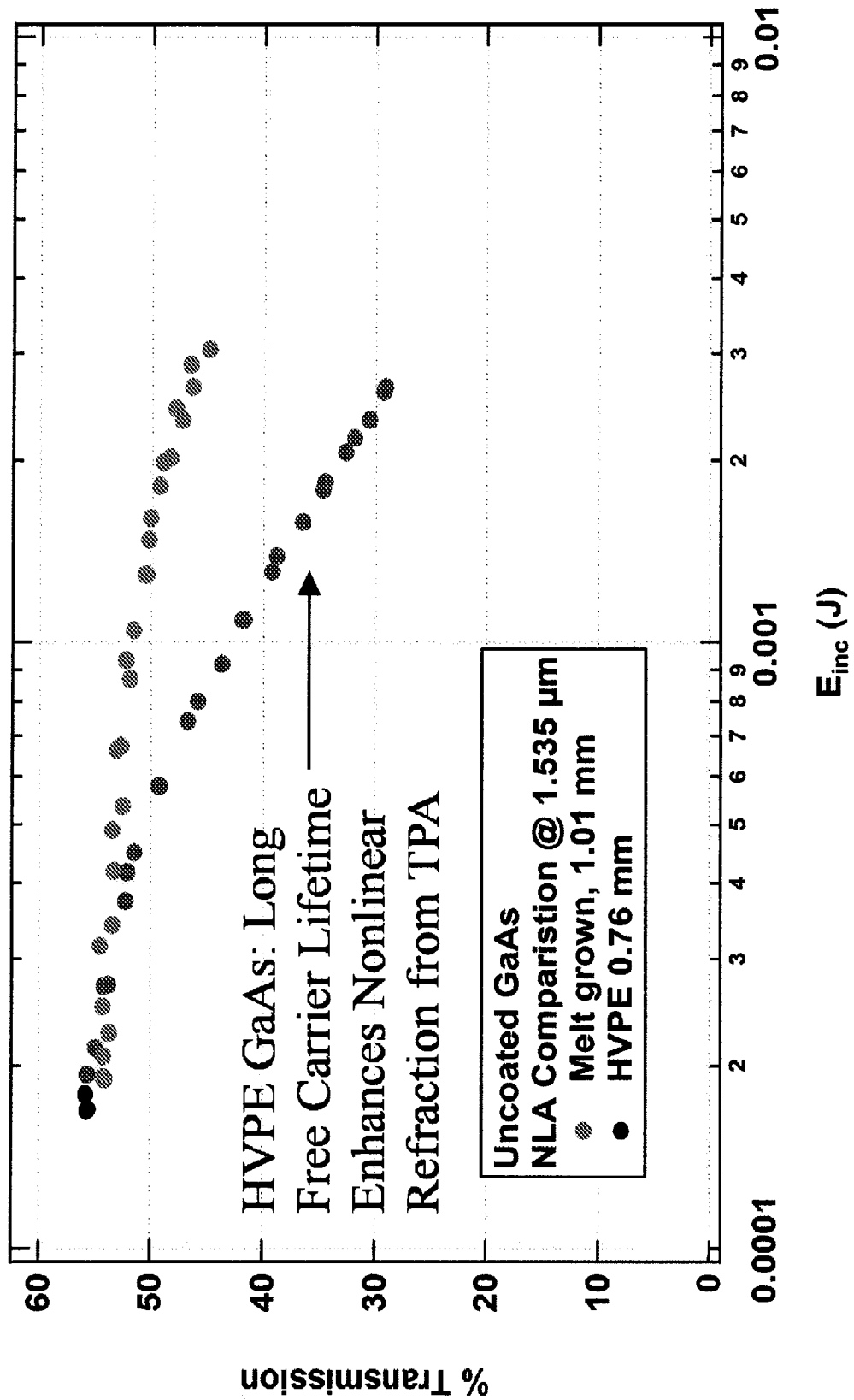
FIG. 2 shows non-linear absorption plots for melt grown and HVPE grown GaAs and that HVPE GaAs has significantly improved non-linear absorption compared to the melt grown sample.

When two-photon absorption at 1064 nm was measured by the inventors for unpatterned LP-HVPE-grown GaAs samples, the nonlinear absorption and self-focusing were found to be much stronger than observed in typical melt-grown GaAs. This stronger than normal non-linear absorption and can be seen in FIG. 2. This non-linear absorption and self-focusing were attributed to longer free-carrier lifetimes than those found in typical GaAs when the non-linear absorption data was combined with the optical absorption data as shown in FIG. 1.

Figure 3:
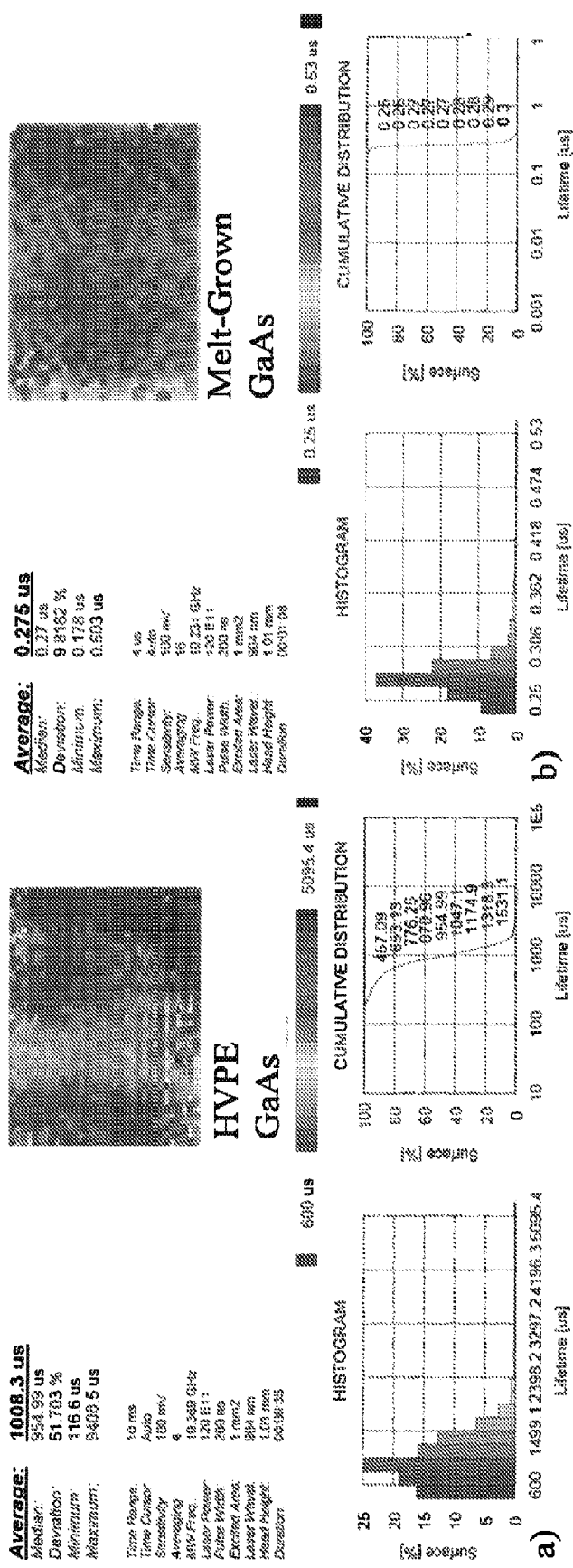
FIG. 3 shows graphs taken by the inventors that show average carrier lifetimes of greater 1000 μs the inventor's highest quality HVPE GaAs wafers versus 0.275 μs in prior art commercial grade GaAs.

Quantitative lifetime measurements were performed using a Semilab WT-2000 microwave photoconductive decay (μ-PCD) wafer test system in which free carriers are generated by illumination with a 904-nm, 200-ns laser and the lifetime is measured via changes in the reflectivity of 10 GHz microwave radiation. The results are shown in the graphs of FIG. 3, indicating average carrier lifetimes>1000 μs in the highest quality HVPE GaAs wafers of the preferred embodiment versus 0.275 in commercial melt-grown GaAs: an improvement of 3-4 orders of magnitude. These measured lifetimes are approximately 3 orders of magnitude longer than the best prior art GaAs ever measured as of Jun. 11, 2013.

To verify these lifetime values, the inventors performed a photoconductive decay experiment using a 532 nm pulsed laser (12-ns, 12-mJ, 5 Hz) to fully illuminate an 8×8×0.5 mm³ LP-HVPE GaAs sample (substrate removed) with a voltage of 6V DC applied across ohmic contacts deposited on opposite edges. The resulting signal was measured with an oscilloscope, and the results were fit to an exponential decay which yielded decay times in the range of 50-100 μs compared to 1000 μs measured by μPCD on the same sample (see the left hand graph in FIG. 3). These values are lower than the values measured through μPCD, but are still 100 times better than the best GaAs reported previously.

The reason for these improvements is fundamental to the growth technique—the concentration of defects that can act as traps is reduced by orders of magnitude because 1) extremely high purities can be achieved from the gas phase and 2) the width of the solid solubility range—and hence the concentration of native stoichiometric defects—is near zero at growth temperatures (680° C. for GaAs) that are hundreds of degrees below the melting point (1240° C. for GaAs).

Figure 4:
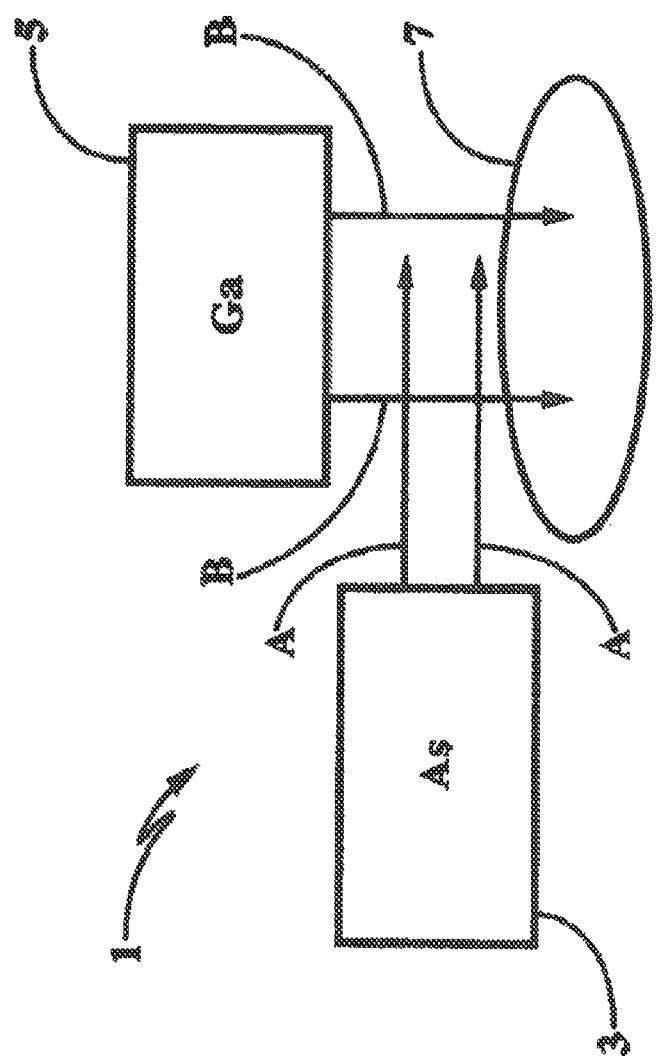
FIG. 4 illustrates a preferred embodiment of a system used to grow a GaAs crystal using a hydride vapor phase epitaxy (HVPE) process.

FIG. 4 illustrates the preferred embodiment of a hydride vapor phase epitaxy (HVPE) system 1 use to grow GaAs crystals. The HVPE system 1 includes an arsenide source device 3 and a gallium source device 5 and a material 7 onto which it is desired to grow GaAs crystal(s). In the preferred embodiment the material 7 where the crystals are grown is a GaAs wafer but it can be other materials. In the preferred embodiment, the As source device 3 is an $AsH_3$ source and the Ga source device 5 is a GaCl source. Preferably, these two source devices 3, 5 deliver Ga and As in a vapor form above the upper surface of the material 7 onto which the GaAs crystal is to be grown. As illustrated, the Ga source device 5 is adapted to deliver Ga in a downward vertical direction as indicated by arrow B and the As source 3 is adapted to deliver As in a horizontal direction as indicated by arrow A.

Having described the components of the HVPE system 1, its use and operation are now described. In operation, the As source device 3 injects $AsH_3$ gas in the horizontal direction of arrows A above the surface of the material 7 onto which GaAs crystal are to be grown. The Ga source device 5 injects the GaCl gas in a vertical downward direction as illustrated by arrows B. In some embodiments, a chlorine transport agent such as HCl, flowing in the presence of a carrier gas ($H_2$) over a metallic Ga source, can be used to form the GaCl in the gallium source device 5. As the $AsH_3$ and GaCl travel in the directions of arrows A and B respectively they react to form GaAs at the surface of the material 7. This reaction takes place according to the equation $GaCl + AsH_3 \Rightarrow GaAs + HCl + H_2$. One key feature of this technique is that the use of a chloride precursor (as opposed to the metal organics used in MOCVD) allows deposition to take place under near-equilibrium conditions.

The HVPE system 1 uses a novel growth technique that overcomes many of the obstacles inherent in melt growth of compound semiconductors. In particular, crystal growth from the vapor phase minimizes the concentration of native stoichiometric defects by deposition at temperatures well below the melting point. The HVPE system 1 produces compound semiconductor GaAs that has increased free carrier lifetime than prior art semiconductor GaAs. The HVPE system 1 also solves the problem of the prior art which was characterized by low free carrier lifetimes for GaAs by eliminating native defects which trap free carriers, particularly As-on-Ga antisite (EL2) defects.

Figure 5A:
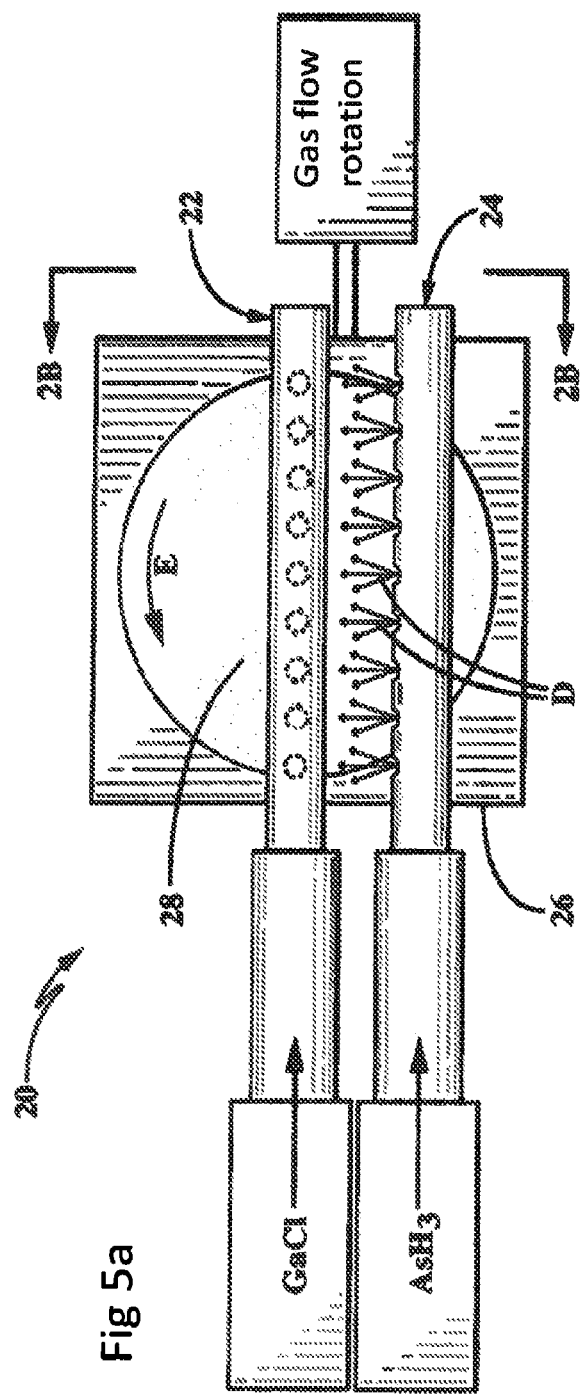
FIGS. 5*a-b* illustrates some example features of an HVPE reactor design for thick-film growth of GaAs.
Figure 5B:
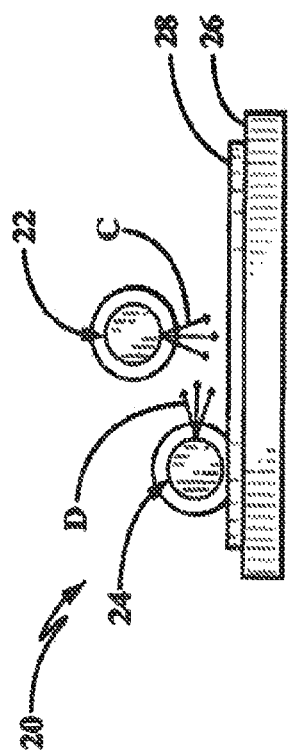

FIG. 5 illustrates another embodiment of an HVPE system 20 for creating GaAs products. This system 20 includes GaCl delivery piping 22 and $AsH_3$ delivery piping 24. A table 26 supports a wafer 28. The GaCl delivery piping 22 can be cylindrical in shape with round openings above where a wafer 28 is mounted. The openings are adapted to deliver GaCl downward from the piping 22 in the direction of arrows C onto the wafer 28. Similarly, the $AsH_3$ piping 24 is cylindrical in shape and has small openings to deliver $AsH_3$ horizontally in the direction of arrows D just above the wafer 28. Of course, those of ordinary skill in the art will appreciated other ways of delivering GaCl and $AsH_3$ to the wafer 28.

Typical growth conditions in the LP-HVPE reactor that produce GaAs with ultra long free carrier lifetimes are listed below. A reactor operating pressure of <100 mbar and a substrate temperature in the range of 680-710 C are used. Typical $AsH_3$ gas flow rates are in the range of 120-240 sccm. Typical GaCl flow rates are in the range of 75-90 sccm. The V/III ratio or the ratio of As to Ga flow rates is in the range of 1-3. Growth rates of GaAs under these conditions range from 85-200 micrometers/hr. Film thicknesses of >2.5 mm have been achieved under these conditions. Longer growth runs have the capability of increasing the thicknesses above 10 mm.

An example of specific LP-HVPE conditions producing GaAs with free carrier lifetimes >10 microseconds is listed below. A reactor operating pressure of 20 mbar was used in conjunction with a substrate temperature of 689.8 C. The $AsH_3$ flow rate was 120 sccm and the GaCl flow rate was 40 sccm which gives a V/III ratio of 3. Gases were reacted at the surface of a rotating GaAs substrate for 600 minutes, producing a vapor grown film of with an average thickness of 1316 micrometers. The average growth rate of the vapor grown GaAs was 132 micrometers/hr during this growth run.

Those of ordinary skill in this the art will appreciate that the preferred embodiment LP-HVPE system 1 dramatically improves upon the prior art by overcoming the limitations of melt growth and offering all of the same advantages of vapor growth: no segregation effects, ultra high purity, superior process control, in-situ diagnostics, scalability, etc. while also performing at growth rates approaching those used for bulk semiconductor growth from the melt (~200 μm/hour). This LP-HVPE system 1 significantly advances the state of the art of semiconductor materials for high resolution radiation detectors, dramatically improves the material quality, and is scalable to production of large quantities and aperture sizes. The novel LP-HVPE system 1 solves the problem of the prior art which was characterized by low free carrier lifetimes for GaAs by eliminating native defects which trap free carriers, particularly As-on-Ga antisite (EL2) defects, by using the novel LP-HVPE growth technique desribed above.

The very long lifetimes of GaAs (up to 10 milliseconds compared to ~1 microsecond in prior art GaAs) grown by the LP-HVPE system 1 could have a revolutionary impact on several applications such as radiation detectors, medical imaging, solar cells, diode lasers, and optical limiters. One of these potential applications, that of radiation detectors is described in more detail following.

Table 1, shown below, lists the properties of traditional elemental (IV) and compound (II-VI and III-V) semiconductor materials used for radiation detector applications. Among these, high purity germanium (HPGe) and cadmium zinc telluride ($Cd_xZn_{1-x}Te$ or CZT) have received the most attention. HPGe has the best energy resolution of commonly used materials, however it requires cryogenic cooling to liquid nitrogen temperatures to function which excludes it from many national security applications. CZT operates at room temperature, but the single crystalline material is exceedingly difficult to grow and has issues with compositional uniformity, twinning, inclusions, etc. that adversely affect device performance.

TABLE 1

Properties of common semiconductor radiation materials.

| | Density (g/cm$^3$) | Band gap (eV) | Pair Creation energy (eV) | Electron mobility-lifetime product (cm$^2$V$^{-1}$s) | Hole mobility-lifetime |
|---|---|---|---|---|---|
| Si | 2.33 | 1.12 | 3.62 | >1 | ~1 |
| Ge | 5.33 | 0.67 | 2.96 | >1 | >1 |
| CdMnTe | 5.8 | 1.73 | 2.12 | >10$^{-6}$ | . . . |
| CdSe | 5.81 | 1.73 | 5.5 | 6.3 × 10$^{-5}$ | 7.5 × 10$^{-5}$ |
| CdTe | 5.85 | 1.44 | 4.43 | 3 × 10$^{-3}$ | 2 × 10$^{-4}$ |
| CdZnSe | 5.5 | 2.0 | 6.0 | ~10$^{-4}$ | 10$^{-6}$ |
| CdZnTe | 5.78 | 1.57 | 4.46 | 4 × 10$^{-3}$ | 1.2 × 10$^{-4}$ |
| GaAs | 5.32 | 1.43 | 4.2 | 8 × 10$^{-5}$ | 4 × 10$^{-6}$ |
| InP | 4.78 | 1.35 | 4.2 | 5 × 10$^{-6}$ | <1.6 × 10$^{-5}$ |

Gallium arsenide (GaAs) has properties similar to CZT, but its application has been limited by low carrier lifetimes (and hence a low mobility-lifetime product, μτ) due to a high concentration of traps (specifically the defect known as EL2, which is an $As_{Ga}$ anti-site). Otherwise, however, the size, quality, and cost of GaAs crystals are far superior to those of CZT. In particular, the band gap of GaAs of 1.42 electron voltage (eV) is near optimum for operation at room temperature. Traditional vapor growth techniques such as molecular beam epitaxy (MBE) and metal organic chemical vapor deposition (MOCVD) are characterized by extremely slow growth rates (~1 μm/hour) which are impractical for producing bulk devices like radiation detectors which are typically several millimeters thick.

The bulk GaAs produced through the LP-HVPE method with high free-carrier lifetimes therefore has the potential to make a large impact in the field of semiconductor radiation detectors by providing a material capable of high energy resolution that can operate at room temperature. These vapor grown crystals will be more reproducible and easier to grow (and hence cheaper) than those of CZT (the current preferred room temperature radiation detector material).

Some example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described.

Moreover, less than all the illustrated blocks may be required to implement an example methodology. Blocks may be combined or separated into multiple components. Furthermore, additional and/or alternative methodologies can employ additional, not illustrated blocks.

In the foregoing description, certain terms where used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, but it can.

What is claimed is:

1. A bulk GaAs product having a carrier lifetime of at least 10microseconds wherein the bulk GaAs product is grown in a low pressure hydride vapor phase epitaxy system and prepared by a process comprising the steps of:
    providing an arsine source;
    providing a gallium chloride source;
    providing a substrate having a growth surface;
    delivering arsine from the arsine source to the substrate in a direction substantially parallel to the growth surface;
    delivering gallium chloride from the gallium chloride source to the substrate in a direction substantially perpendicular to the growth surface; and
    mixing and effecting the reaction of the gallium chloride with the arsine directly at the growth surface.

2. The bulk GaAs product of the process of claim 1, wherein the bulk GaAs is adapted for use in at least one of the group of: an electrical device, an optical device, a medical imaging application, a photovoltaic application, a laser diode application, a radiation detector, and an optical limiting application.

3. The bulk GaAs product of the process of claim 1, wherein the substrate is a monocrystalline wafer of GaAs.

4. The bulk GaAs product of the process of claim 1 wherein the carrier lifetime is at least 50 microseconds.

5. The bulk GaAs product of the process of claim 1 wherein the carrier lifetime is at least 100 microseconds.

6. The bulk GaAs product of the process of claim 1 wherein the carrier lifetime is at least 400 microseconds.

7. The bulk GaAs product of the process of claim 1 wherein the carrier lifetime is at least 500 microseconds.

8. The bulk GaAs product of the process of claim 1 wherein the carrier lifetime is at least 1000 microseconds.

9. The bulk GaAs product of the process of claim 1, wherein the process further comprises growing the bulk GaAs to a thickness of at least 500 micrometers.

10. The bulk GaAs product of the process of claim 9 wherein the bulk GaAs is greater than 2.5 millimeters thick.

11. The bulk GaAs product of the process of claim 1, wherein the process further comprises growing the bulk GaAs at a growth rate in a range from 85 µm/hr to 200 µm/hr.

12. The bulk GaAs product of the process of claim 1, wherein the process further comprises growing the bulk GaAs product at a growth temperature in a range from 680° C. and 710° C.

13. The bulk GaAs product of the process of claim 1, wherein the process further comprises growing the bulk GaAs product at a growth pressure of at most about 20 mbar.

14. The bulk GaAs product of the process of claim 1, wherein a V/III ratio during GaAs growth is in a range of 1-3.

15. The bulk GaAs product of the process of claim 9 wherein the bulk GaAs is greater than 1.0 millimeter thick.

16. A method comprising:
    providing a low pressure hydride vapor epitaxy system having an arsine source and a gallium chloride source adapted to produce a bulk GaAs;
    delivering arsine from the arsine source to a substrate within the low pressure hydride vapor epitaxy system, the substrate having a growth surface, wherein the arsine is delivered in a first direction parallel to the growth surface;
    delivering gallium chloride from the gallium chloride source within the low pressure hydride vapor epitaxy system, wherein the arsine is delivered in a second direction perpendicular to the growth surface; and
    effecting the reaction of the gallium chloride with the arsine directly at the substrate's growth surface to grow a bulk GaAs having a carrier lifetime of at least 10 microseconds.

17. The method of claim 16, further comprising:
    growing the bulk GaAs to a thickness greater than at least 500 micrometers.

18. The method of claim 16, wherein the substrate is a monocrystalline wafer of GaAs.

* * * * *